United States Patent [19]
Zhou

[11] Patent Number: 5,432,150
[45] Date of Patent: Jul. 11, 1995

[54] HIGH-TC SUPERCONDUCTING CERAMIC OXIDE PRODUCTS AND MACROSCOPIC AND MICROSCOPIC METHODS OF MAKING THE SAME

[76] Inventor: Dawei Zhou, 2026 NW. 36th St., Gainesville, Fla. 32606

[21] Appl. No.: 76,178

[22] Filed: Jun. 14, 1993

Related U.S. Application Data

[63] Continuation-in-part of Ser. No. 716,929, Jun. 18, 1991, Pat. No. 5,219,832.

[51] Int. Cl.$^6$ .......................................... H01L 39/24
[52] U.S. Cl. ........................... 505/400; 29/599; 505/432; 505/500; 505/924; 505/925
[58] Field of Search ............. 505/400, 430, 432, 924, 505/925, 433, 500, 501; 29/599; 335/216

[56] References Cited

U.S. PATENT DOCUMENTS

| | | |
|---|---|---|
| 3,158,794 | 11/1964 | Swartz . |
| 3,491,318 | 1/1970 | Henning et al. . |
| 3,496,622 | 2/1970 | Berghout et al. . |
| 4,050,147 | 9/1977 | Winter et al. . |
| 4,274,889 | 6/1981 | Tachikawa et al. . |
| 4,584,547 | 4/1986 | Thornton . |
| 4,704,249 | 11/1987 | Glatzle . |
| 4,808,488 | 2/1989 | Chevrel et al. . |
| 4,924,091 | 5/1990 | Hansma . |
| 4,939,121 | 7/1990 | Rybka . |
| 4,952,554 | 8/1990 | Jin et al. . |
| 4,957,901 | 9/1990 | Jacobson et al. . |
| 4,960,752 | 10/1990 | Ashok et al. . |
| 4,965,249 | 10/1990 | De With et al. . |
| 4,968,662 | 11/1990 | Urano et al. . |
| 4,970,197 | 11/1990 | Shiota et al. . |
| 4,970,483 | 11/1990 | Wicker et al. . |
| 4,973,574 | 11/1990 | Nishio et al. . |
| 4,974,113 | 11/1990 | Gabrielse et al. . |
| 4,975,411 | 12/1990 | Danby et al. . |
| 4,975,412 | 12/1990 | Okazaki et al. . |
| 4,975,414 | 12/1990 | Meeks et al. . |
| 4,975,416 | 12/1990 | Onishi et al. . |
| 5,004,722 | 4/1991 | Tallman . |
| 5,047,633 | 9/1991 | Finlan et al. . |
| 5,075,286 | 12/1991 | Powell et al. ..................... 29/599 X |
| 5,232,906 | 8/1993 | Yamamoto et al. ............... 29/599 X |
| 5,304,602 | 4/1994 | Yamamoto et al. ............... 29/599 X |

Primary Examiner—Joseph M. Gorski
Attorney, Agent, or Firm—Saliwanchik & Saliwanchik

[57] ABSTRACT

High-Tc superconducting ceramic oxide products and macroscopic and microscopic methods for making such high-Tc superconducting products. Completely sealed high-Tc superconducting ceramic oxide products are made by a macroscopic process including the steps of pressing a superconducting ceramic oxide powder into a hollow body of a material inert to oxygen; heat treating the superconducting ceramic oxide powder packed body under conditions sufficient to sinter the ceramic oxide powder; and then sealing any openings of the body. Optionally, a waveform or multiple pulses of alternate magnetic field can be applied during the heat treatment. The microscopic method of producing a high-Tc superconducting ceramic oxide product includes the steps of making a high-Tc superconducting ceramic oxide thin film; optionally sintering the deposited thin film in a magnetic field; and removing partial oxygen content of the thin film by a scanning tunneling electron treatment machine to form a microscopic insulation layer between two high-Tc superconducting domains of the thin film.

9 Claims, 8 Drawing Sheets

HIGH-TC SUPERCONDUCTING CERAMIC OXIDE PRODUCTS AND MACROSCOPIC AND MICROSCOPIC METHODS OF MAKING THE SAME

This application is a continuation-in-part of application Ser. No. 07/716,929, filed Jun. 18, 1991 and now U.S. Pat. No. 5,219,832.

BACKGROUND OF THE INVENTION

The present invention relates to high-Tc superconducting ceramic oxide products, and macroscopic and microscopic methods for making such high-Tc superconducting products. The high-Tc superconducting ceramic oxide products of the present invention have a high critical current density, high critical magnetic field, long life and are capable of being recharged or having superconductivity regenerated.

Since the initial discovery of high-Tc superconductivity in metal-oxide ceramics, many people have tried to determine the underlying physical origin of this superconductivity. It is generally agreed that the microstructure of the $CuO_2$ plane of high-Tc superconductors plays a key role in high-Tc superconductivity. Viewed in two dimensions, there are four oxygen atoms around a single Cu atom in high-Tc metal-oxide superconducting ceramics (in three dimensions, there would be six oxygen atoms around one Cu atom), and each Cu atom can supply at most three electrons to its nearest neighbors. This means that there can be no stable valence bond between the Cu atoms and the oxygen atoms. The Cu electrons are, therefore, only weakly localized and can pass across the oxygen bridges to complete quantum tunneling. Such collective quantum tunneling plays the key role in the high-Tc superconductivity. Since the exchange interaction between the two Cu ions is mediated via the oxygen ions, the extra spin of a hole localized on the oxygen will have a big effect. Designating the two Cu ions spins by $\vec{S}_1$ and $\vec{S}_2$ and the 0 by $\vec{\sigma}$, the $\vec{\sigma}$ would prefer to be parallel or antiparallel in respect to both $S_1$ and $S_2$. The spins of high-Tc superconductors are, therefore, very disordered. The local spin wavefunction is either symmetric or antisymmetric and is rapidly changing with time, because of the mixed valence resonance vibration. The disordered spin wavefunction will be automatically adjusted to accompany the tunneling electrons.

The present invention relates to new methods of making completely sealed high-Tc superconducting products using metallic oxide ceramics, and to the completely sealed high-Tc superconducting products produced thereby. The inventive methods and products are based on the realization that the oxygen content of the metal-oxides plays an important role in high-Tc superconductors and products incorporating the same. Below a critical oxygen content $X_{c1}(O)$, or above a critical oxygen content $X_{c2}(O)$, superconductivity is destroyed. The transition temperature Tc changes in between these critical concentrations. For example, for the superconducting oxide system $YBa_2Cu_3O_x$, $X_{c1}(O)=6.5$ and $X_{c2}(O)=7.0$. Experiments show that if oxygen atoms escape from high-Tc superconductors, thereby lowering the oxygen content to less than the critical oxygen content $X_{c1}$, the superconductivity of the metal-oxide is destroyed. If the oxygen content is then increased, for example by sintering the oxygen-depleted metal-oxide ceramic within a predetermined temperature range in the presence of oxygen, the superconductivity will be restored. The principal point is that for $YBa_2Cu_3O_x$ superconductors, the oxygen content $X(O)$ must satisfy the equation $6.5 < X(O) < 7.0$, and for all high-Tc oxide superconductors the oxygen content $X(O)$ must satisfy the equation $X_{c1} < X(O) < X_{c2}$.

The high-Tc superconductivity state of oxide ceramics is only a metastable state, and the superconductive oxide ceramics will tend to lose oxygen to become a stable state insulator. This process of oxygen loss may take a few hours, a few days, a few months, or even a few years or longer depending upon the conditions surrounding the superconductive oxide including temperature, atmosphere, and the like. However, regardless of how long the oxygen loss process may take, the tendency of the metastable superconductive state to change to the stable insulative state is certain. Therefore, to protect the high-Tc superconductivity of oxide ceramics, the oxygen content of the ceramic corresponding to the superconductive state must be maintained.

The present invention provides a completely sealed superconducting product whereby the oxygen loss is prevented and a long-lived high-Tc superconducting ceramic oxide product is attained. As described in detail, hereinafter, the seal can be made using metal, plastic or any materials which are inert to oxygen.

The present invention is also based on the recognition that the high-Tc superconductors are ceramic materials, a basic property of which is brittleness. Because of this brittle characteristic of ceramic superconductors, many attempts were made to produce high-Tc superconducting ceramic products using traditional methods to make wires, cables, tapes and the like, and then making superconducting products from the superconducting ceramic-containing wires, cables and tapes. Examples of such wire, cable and tape methods of producing superconducting ceramic products include: U.S. Pat. Nos. 4,952,554; 4,965,249; 4,975,416; and 4,973,574. Other methods of making superconducting ceramic products are shown, for example, in the following U.S. Pat. Nos. 4,975,411; 4,975,412; 4,974,113; 4,970,483; 4,968,662; 4,957,901; 4,975,414; and 4,939,121.

However, all of these prior attempts to make high-Tc superconducting ceramic oxide products suffer from one or more disadvantages. The wire and cable making methods typically include a drawing or working step to reduce the diameter of the superconducting ceramic oxide product. Such drawing and working steps are liable to break the brittle ceramic oxide product, therefore the breaking and sintering cycles will repeat again and again and the resulting wires have poor flexibility and discontinuity caused by breaking. Further, prior attempts to produce superconducting ceramic products have not had the high mass density necessary to achieve high current density, have had an insufficient ratio of superconducting cross-sectional area to non-superconducting cross-sectional area, and have suffered undesirable oxygen loss resulting in loss of superconductivity. In addition, prior methods of making high-Tc superconducting ceramic oxide products have been costly, involving expensive materials and numerous, time consuming steps, and have produced products of only limited shapes suitable for only limited applications. Also, prior methods could not, or could not easily, make high-Tc superconducting connections, which is necessary, especially for making a high-Tc superconducting magnet. A key technology for making high-Tc superconductive magnets is the making of zero resistance connections.

This invention also attempts to apply an alternate or a selective waveform pulse magnetic field to destroy the magnetic moment order (which does not do good to the high-Tc superconductivity), to accelerate oxygen to occupy the positions of $CuO_2$ planes, and to orient the $CuO_2$ plane to a desired direction by the dynamic process of the alternate field during the heat treatment. This invention using a dynamic field has high efficiency compared with a static magnetic field. This is because $\frac{d\vec{m}}{dt} = \gamma \vec{M} \times \vec{H}(t)$, $\vec{M}$ is magnetization and $\vec{F}(t)$ is alternate field. The dynamics is very important; therefore, alternate field will rapidly rotate magnetic moment randomly, and create the condition to accelerate oxygen to occupy position on $CuO_2$ plane, because AF local magnetic order resists diffusion of oxygen. Therefore, the applied alternate field is much better than an applied static magnetic field.

SUMMARY OF THE INVENTION

The present invention relates to high-Tc superconducting ceramic oxide products and to macroscopic and microscopic methods of making such products. The superconducting ceramic oxide used to produce the superconducting products of the invention can be any superconducting ceramic oxide (including the A1 oxide family) and, for example, is an $REBa_2Cu_3O_{9-\delta}$ ceramic, wherein RE is one or more rare earth elements from the group Y, La, Eu, Lu and Sc, and $\delta$ is typically in the range from 1.5 to 2.5. One specific ceramic oxide for use in the products of the present invention is $YBa_2Cu_3O_x$, wherein X is between 6.5 and 7.0. Other examples of suitable high-Tc superconducting ceramic oxides include: $Bi_2Sr_2Ca_2Cu_3O_x$, HgBaCaCuO system, $(Bi, Pb)_2Sr_2Ca_2Cu_3O_x$, $Bi_2Sr_2CaCu_2O_{8+x}$, $La_{2-x}Sr_x$-$CuO_{4+y}$ and $Tl_2Ba_2Ca_{n-1}Cu_nO_{2n+3}$.

The high-Tc superconducting ceramic oxide product of the present invention are produced such that oxygen loss is minimized or substantially prevented and the superconducting properties of the ceramic oxide products are maintained for a substantial, even indefinite, period of time. One method for producing a superconducting ceramic oxide product according to the present invention is a macroscopic method of producing completely sealed high-Tc superconducting ceramic oxide products. This macroscopic method comprises the steps of making a superconducting ceramic oxide powder; providing a hollow body of a material which does not react with oxygen; pressing the superconducting ceramic oxide powder into the hollow body at a net pressure of at least from $5 \times 10^4$ psi to $1 \times 10^7$ psi, preferably at least $1.2 \times 10^5$ psi for $YBa_2Cu_3O_x$ (the pressure will depend upon the material and shape); heat treating the body with the superconducting ceramic oxide powder pressed therein in an oxygen atmosphere at temperatures and for time periods of sintering, annealing and cooling which are sufficient for sintering the ceramic oxide powder; optionally applying a waveform or multiple pulses of alternate magnetic field (from 0.0001 Tesla to 300 Tesla) during the sintering and subsequent heat treatment procedure to dynamically destroy local magnetic moment and dynamically accelerate oxygen to occupy positions in the $CuO_2$ planes and dynamically to orient the microscopic $Cu_2$ plane to desired direction to carry high critical current and high critical field, the applied field strength varying with the material and the shape of the products; and then sealing the ends of the body and/or any other openings which may have been formed in the body prior to sintering. Local heat treatment can also be used to make connections between high-Tc superconducting products or a product and superconducting lead. If the superconducting ceramic oxide product has a complicated shape, connections between hollow bodies having the superconducting ceramic oxide powder pressed therein are joined and then a second pressing step is performed to ensure that all connections are filled with superconducting powder continuously without any gaps before sintering.

The completely sealed high-Tc superconducting ceramic oxide products produced by the macroscopic method of this invention may be of any desired shape and size and are suitable for use as high-Tc superconducting magnets, high-Tc superconducting motors, high-Tc superconducting generators, high-Tc superconducting transportation lines, high-Tc superconducting electric energy storage devices, or components thereof, and, in general, may be used for any purpose which requires a superconductor.

The microscopic method of producing a high-Tc superconducting ceramic oxide product of the present invention is also based on the isolation (or "sealing") of a superconducting ceramic oxide composition to prevent oxygen loss or diffusion and the resultant loss of superconductivity. The inventive microscopic method of making high-Tc superconducting ceramic oxide products comprises the steps of: making a high-Tc superconducting ceramic oxide thin film on a substrate in situ, optionally with an alternate magnetic field being applied during the in situ making process by electron beam deposition, molecular beam deposition, sputtering deposition, laser ablation or any other suitable means, and optionally then sintering the deposited thin film in a magnetic field in an oxygen atmosphere, if necessary; and removing partial oxygen content by a scanning tunneling electron treatment machine (STETM) from a microscopic domain, e.g., 5 Å to 1000 Å, of the superconducting ceramic oxide thin film to form a microscopic insulation layer between two high-Tc superconducting domains which form a Josephson junction. High-Tc superconducting products made by the microscopic method of the present invention are particularly useful as high-Tc superconducting chips, high-Tc superconducting electric circuits, SQUIDS, and components thereof.

Therefore, it is an object of the present invention to provide high-Tc superconducting ceramic oxide products which do not suffer from the disadvantages of prior superconducting ceramic products.

Another object is to modify a scanning tunneling microscope machine to a STETM, that is, from a microscope to an electron treatment machine for making microscopic patterns as desired by localized electric current and which not only can be used to produce high-Tc superconducting products but also can be used in the semiconductor industry.

Another object of the present invention is to provide high-Tc superconducting ceramic oxide products which are sealed to prevent oxygen loss and loss of superconductivity.

Still another object of the present invention is to provide a macroscopic method for making high-Tc superconducting ceramic oxide products which does not require conventional wire and cable making techniques such as drawing and cold working.

It is still another object of the present invention to provide a macroscopic method for making high-Tc superconducting ceramic oxide products of a variety of shapes, sizes and configurations.

Yet another object of the present invention is to provide a method for making high-Tc superconducting ceramic oxide products whereby the superconducting ceramic oxide compositions are mechanically, electrically and chemically protected.

A further object of the present invention is to provide macroscopic and microscopic methods for producing high-Tc superconducting ceramic oxide products of high quality and having a long life.

Still a further object of the present invention is to provide a microscopic method for producing high-Tc superconducting ceramic oxide products.

Yet a further object of the present invention is to provide an apparatus and method for forming microscopic insulating layers or domains within a superconducting ceramic oxide thin film.

Another object of the present invention is to provide a method for making continuous superconducting connections between high-Tc superconducting products.

Another object of the present invention is to provide a method using alternate magnetic field during the heat treatment procedure for producing superconducting products, in order to destroy local magnetic moment, to accelerate oxygen to occupy $CuO_2$ plane position, and to orient $CuO_2$ plane to desired orientation dynamically.

These and other objects of the present invention will be further understood by reference to the following detailed description and drawings, wherein:

DETAILED DESCRIPTION OF THE INVENTION

Figure 1:
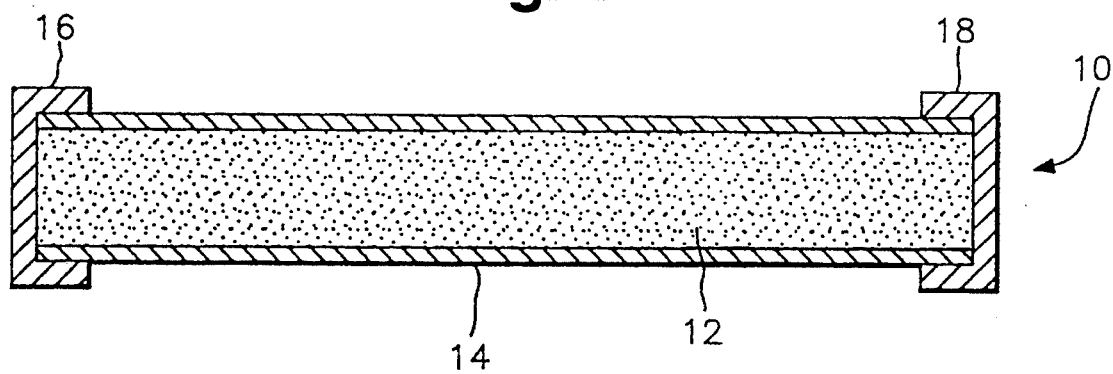
FIG. 1 cross-sectional view of a first embodiment of a sealed, high-Tc superconducting ceramic oxide product produced by the macroscopic method of the present invention.

Referring now to the drawing figures, and in particular FIGS. 1-7, there are shown several embodiments of a completely sealed, high-Tc superconducting ceramic oxide product of the present invention. Each of these embodiments is made by the macroscopic method of the invention. To produce the completely sealed superconducting products of FIGS. 1-7, the following macroscopic method is used.

First, the compounds or ingredients for making a high-Tc superconducting ceramic oxide composition are mixed together in powder form, by standard powder metallurgical techniques. For example, high purity $Y_2O_3$, $BaCO_3$ and $CuO$ powders are mixed together, without water content, to make the preferred high-Tc superconducting composition $YBa_2Cu_3O_x$. Then, the mixed powder is heated up to 940° C. in an unglazed ceramic crucible in a well ventilated oven for about 12 hours, and then cooled over a period of about 3 hours. The powder mixture is then kept at a temperature of about 450° C. for another about 3 hours and then cooled slowly to room temperature. After pulverizing and mixing the resultant powder, the same procedure is repeated for another 6 to 12 hours, with oxygen flowing through the oven. This procedure produces a high-Tc superconducting black colored powder. The powder is then reground a third time.

This superconducting powder is then used in the macroscopic method of the present invention as follows. The superconducting powder is pressed into a tube or preform made of any suitable material which does not react with oxygen. The tube or preform may be made of a metal which does not react with oxygen or a plastic material. Examples of suitable materials which are inert to oxygen include stainless steel, copper and copper-nickel alloys, including $Cu_{90}Ni_{10}$ and $Cu_{70}Ni_{30}$ and others. The tube should be made of a material having a melting point higher than the sintering temperature of the high-Tc superconducting ceramic oxide being used, and generally the melting point of the tube material should be higher than 1000° C. Any material having a sufficiently high melting point can be used for the tube or preform. If the preform is made of a material which is not inert to oxygen, then a coating of a material inert to oxygen should be provided on the inner surface of the preform. Alternatively, a second tube of a material inert to oxygen could be nested within the preform to provide the necessary protection to the high-Tc superconducting ceramic oxide. Silver and silver alloys are especially preferred materials for use as an inner surface coating for the preform or for the nested inner tube. Of course, an inner surface coating or inner tube can be used with an outer preform made of a material inert to oxygen, in order to provide additional sealing and protection.

Figure 15:
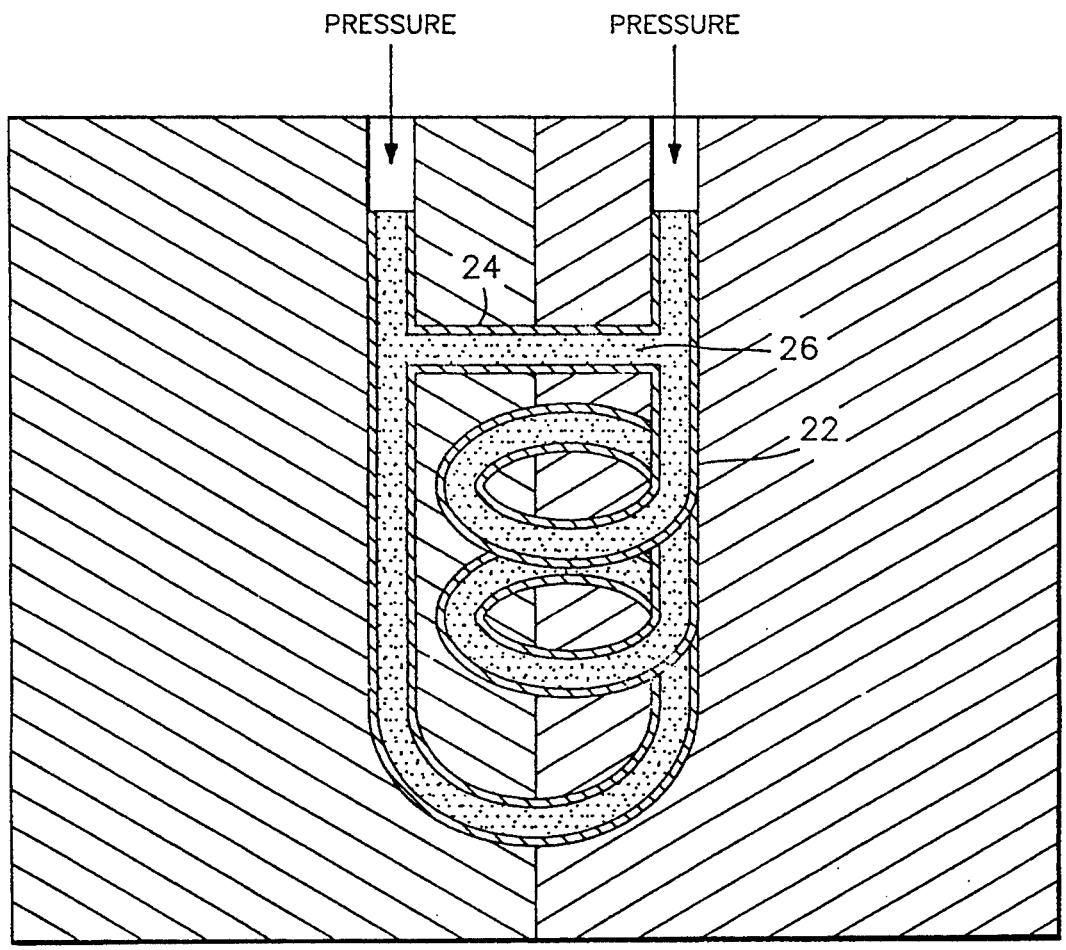
FIG. 15 is a schematic illustration of ceramic powder-containing hollow body in a casing suitable for pressurizing in accordance with the present invention.

A pressure sufficient to obtain a net pressure greater than about $5\times 10^4$ psi is applied to the superconducting powder to ensure that the powder is completely pressed into the tube or preform with no vacant volume. The applied pressure is selected to ensure that the desired density of the packed powder is obtained. For example, to obtain a density of about 5.0 grams/cm$^3$ of a YBa$_2$Cu$_3$O$_x$ powder, an applied pressure of $1.2\times 10^5$ psi is used. This net pressure can be achieved using a mechanical press, liquid press, high pressure 895 press and any high pressure technique can be used. To guarantee the required high net pressure, the packed tubes should be surrounded by a solid metal base such as surrounding base 200 shown in FIG. 15, very similar to the solid metal model for casting. The tube or preform having the packed superconducting powder therein, with the ends of the tube or preform being open, is then heat treated under conditions suitable to impart superconductivity to the high-Tc superconducting oxide. The exact conditions for heat treatment will depend on the type of high-Tc superconducting ceramic oxide being used.

Those skilled in the art will be able to determine proper heating and cooling conditions without undue experimentation. For a YBa$_2$Cu$_3$O$_x$ ceramic oxide, the heat treating comprises sintering the high-Tc superconducting ceramic oxide packed preform at a temperature between about 850° C. and 1030° C. for a time between about 0.1 and 100 hours in air; slowly cooling the high-Tc superconducting ceramic oxide packed preform to about 450° C. to 600° C. and maintaining it at this temperature for about 1 to 100 hours with an O$_2$ flow; and then slowly cooling to room temperature. As another example, for a (Bi, Pb)$_2$Sr$_2$Ca$_2$Cu$_{3x}$ ceramic oxide, the sintering conditions will be a temperature of about 830° C. for 1–150 hours, followed by a slow cool in low oxygen pressure (about 5% to 20% O$_2$ plus 95% to 80% argon or nitrogen gas) or any air environment containing O$_2$.

In a preferred embodiment, the packed tube or preform with YBa$_2$Cu$_3$O$_x$ therein is heated in a furnace or oven from room temperature to 940° C. over a period of about 3 hours and then is maintained at a temperature of about 940° C. in air for about 6 hours. An O$_2$ flow is then started through the oven or furnace and the sample is gradually cooled to 550° C. over a period of about 10 hours, and then is cooled to a temperature of about 200° C. over another period of about 10 hours while maintaining the O$_2$ flow, and then slowly to room temperature, again with the O$_2$ flow, over another 10 hour period of time. If the preform is a complicated shape rather than a simple tube, apertures may be opened in the preform in addition to the open ends thereof, to guarantee oxygen flow through the entire product. These apertures are resealed after sintering is completed.

The thus sintered product is then tested for zero resistance and for the Meissner effect. The sintered product thus having demonstrated superconductivity, the ends of the tube or preform are sealed to prevent oxygen loss and complete production of the completely sealed high-Tc superconducting ceramic oxide products of the present invention.

Figure 8B:
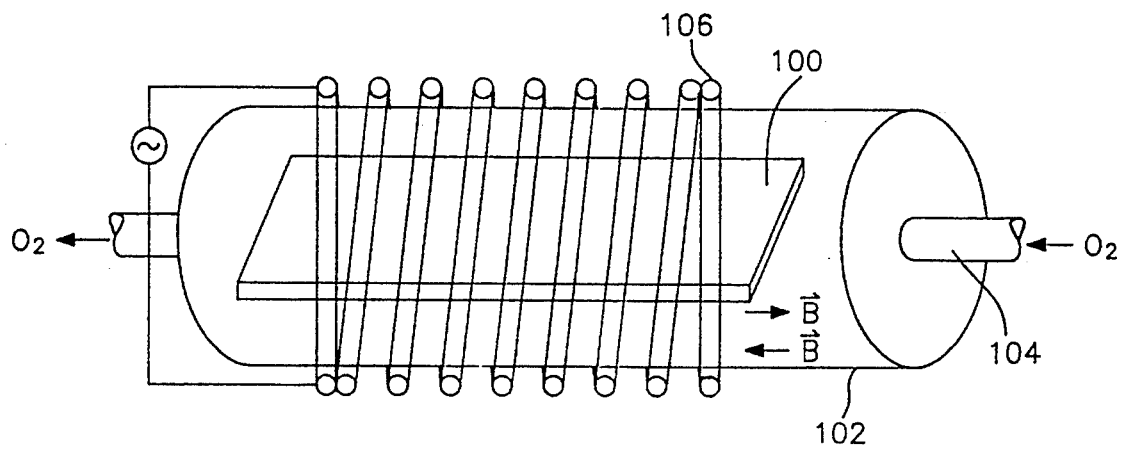
FIG. 8a and FIG. 8b are schematic illustrations of the sintering of a high-Tc superconducting ceramic oxide macroscopic product and thin film, respectively, in an alternate magnetic field according to the macroscopic and microscopic methods of the present invention, respectively.
Figure 8A:
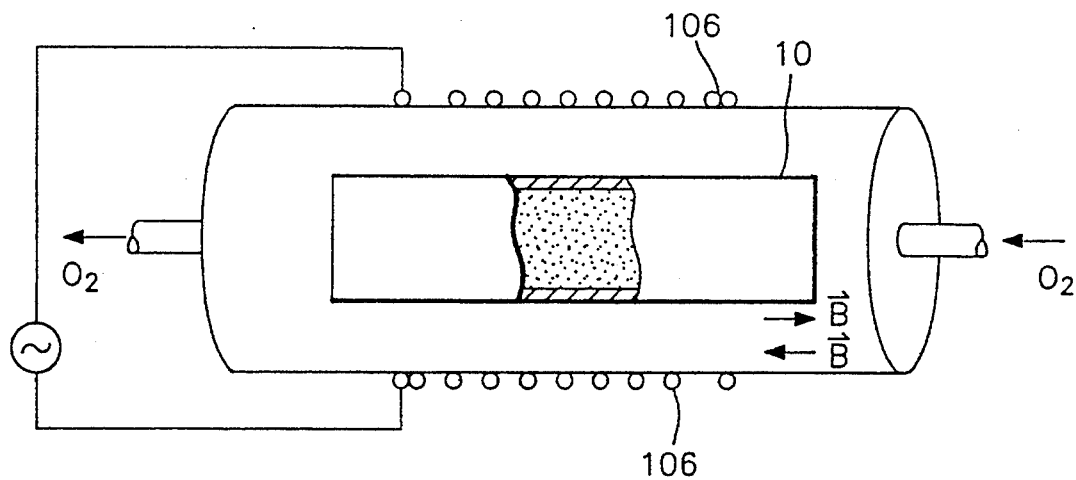

With more particular reference to the drawing figures, the completely sealed high-Tc superconducting product 10 of FIG. 1 is produced as follows. A superconducting ceramic oxide powder 12 is pressed into a tube 14 at a pressure greater than $1.2\times 10^5$ psi; the packed tube is then sintered in an oxygen atmosphere as detailed above, preferably with the oxygen flowing at a rate greater than 1 atmosphere; and then end seals 16, 18 are applied to the open ends of the tube 14 of the sintered product to effect the complete seal. An alternate magnetic field can be applied during the heat treatment period as shown in FIG. 8a. Prior to sealing the ends of the tube 12, the high-Tc superconducting properties of the product are verified or determined as discussed above. The end seals 16, 18 may be applied by any known means which are effective to ensure a fluid tight seal, for example, welding or screw sealing endcap. The tube 14 may have any desired cross section, such as circular, rectangular or square, depending upon the desired end use of the superconducting product. Local heating can be used to make superconducting connections between superconducting products or leads, under certain pressures and in oxygen or air environment, electrical heating or any other local heating can be used.

Figure 2:
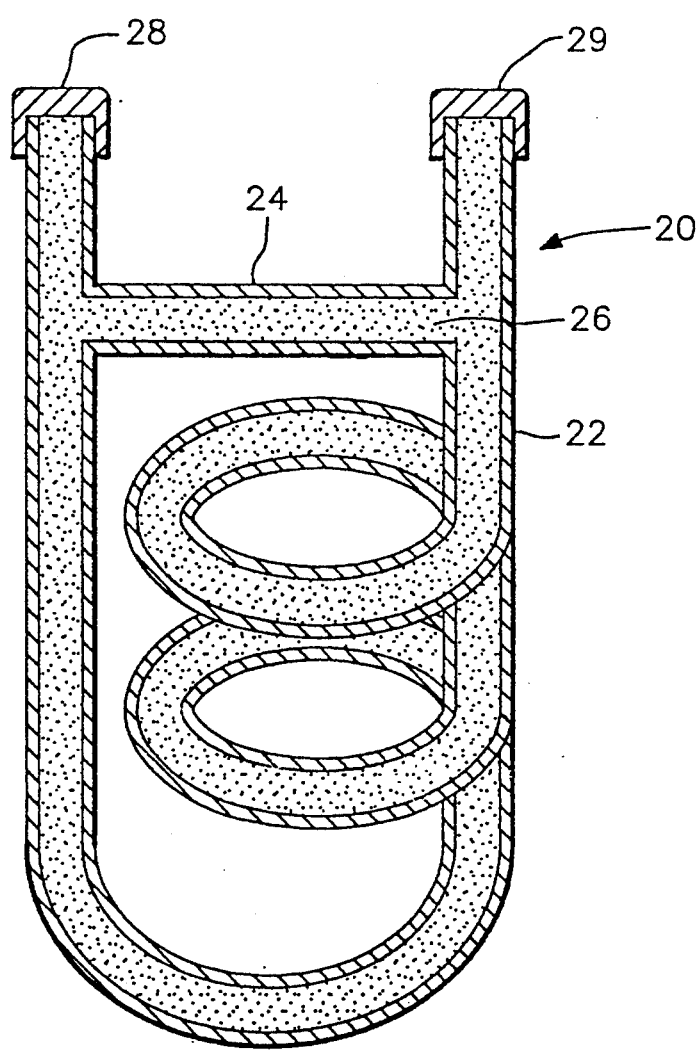
FIG. 2 is a cross-sectional view of a second embodiment of a sealed, high-Tc superconducting ceramic oxide product (high-Tc superconducting magnet) produced by the macroscopic method of the present invention.
Figure 3:
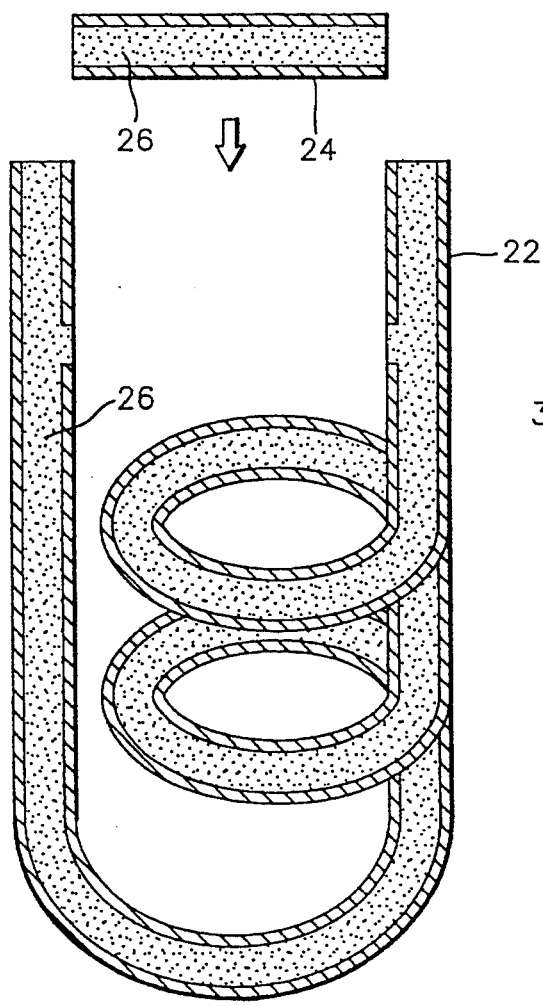
FIG. 3 is an exploded, cross-sectional view of the components for producing the superconducting product (high-Tc superconducting magnet) shown in FIG. 2.

The macroscopic process of the present invention also provides a simple method for producing high-Tc superconducting ceramic oxide products of various shapes, including complicated and composite shapes, as illustrated in FIGS. 2–6c. FIGS. 2 and 3 illustrate, respectively, a high-Tc superconducting magnet produced according to the present invention, and the component parts thereof. The high-Tc superconducting magnet shown in FIG. 2 provides a complete, continuous superconducting loop without any welding, soldering or pressing joints after making. To produce the superconducting magnet product 20 shown in FIG. 2, two metal, preferably stainless steel, tubes 22, 24, which do not react with oxygen, are provided and tube 22 is wound into an appropriate coiled configuration. Next, the high-Tc superconducting ceramic oxide 26, in powder form, is pressurized at a pressure of at least $1.2\times 10^5$ psi in each of the metal tubes 22, 24.

It is to be understood that the steps of shaping the metal tube into a desired configuration and pressurizing the powder thereinto can be reversed. That is, the metal tube can be shaped into a desired configuration after at least a portion of the superconducting ceramic oxide powder has been pressurized therein. One example of the reversed procedure is as follows. A high-Tc superconducting ceramic oxide, in the form or a powder or a pellet having a density greater than 75% of ideal, is pressed into a metal tube to form a continuous body. Then the metal tube with the high-Tc superconducting ceramic oxide therein is heated above the softening point of the metal tube material, generally between about 100° and 800° C., but below the sintering temperature of the high-Tc superconducting ceramic oxide. After heating the metal tube above its softening point, the metal tube with the high-Tc superconducting ceramic oxide therein can be bent into any desired shape, such as the coil shape shown in FIGS. 3 and 6d.

After the superconducting ceramic oxide powder has been pressurized into each of the metal tubes 22, 24, the tubes 22, 24 are assembled, as shown in FIG. 3, to form the desired complicated shape of the superconducting magnet 20. Metal tube 24 is joined to metal tube 22 by any suitable means, such as by welding or any other tube connection method.

After the metal tubes 22, 24 have been joined, the powder is again pressurized under a pressure between about $5\times 10^4$ psi and $1\times 10^7$ psi to make a continuous connection without any gap in the entire tubular structure of the product, to safeguard against gaps between tube 22 and tube 24 and potential oxygen loss. This repressurizing of the superconducting ceramic oxide powder ensures that there is a continuous connection through the joints where the subparts, i.e., metal tubes 22, 24, have been joined to make the final shape.

Then, the preform having the packed superconducting powder therein is sintered, as described above, in an oxygen atmosphere. For a complicated shape such as that of the superconducting magnet shown in FIG. 2, it is preferable that some apertures or windows be opened in the metal tubes 22, 24 to ensure that oxygen flows throughout the entire body. After the high-Tc superconducting properties of the sintered product have been checked, the product is completely sealed by resealing the apertures or windows, if any, and completely sealing the ends of the metal tube 26 with endcaps 28, 29.

Figure 5:
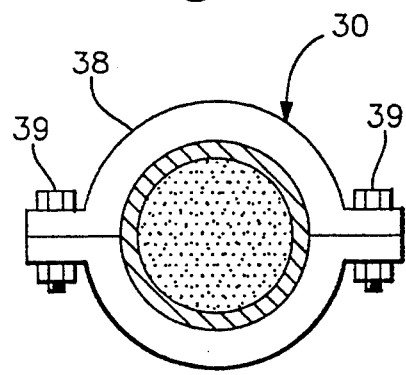
FIG. 5 is a cross-sectional view of a sealed connection, taken along line V—V of FIG. 4.
Figure 4:
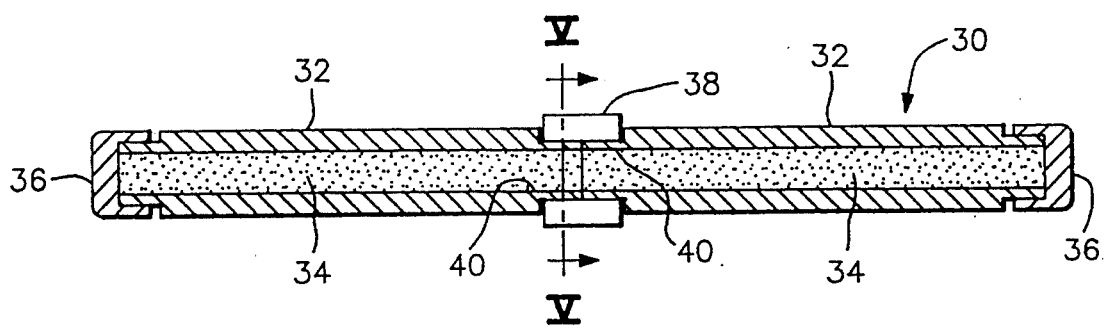
FIG. 4 is a cross-sectional view of a third embodiment of a sealed, high-Tc superconducting ceramic oxide product produced by the macroscopic method of the present invention.

Referring now to FIGS. 4 and 5, there is shown a superconducting ceramic oxide product made by joining or connecting, in end-to-end relation, two sintered products similar to the sintered product 10 shown in FIG. 1. More particularly, as shown in FIG. 4, two sintered products, each having a tube 32 with sintered superconducting ceramic oxide powder 34 pressed therein and sealed at one end with an endcap 36 are joined by connector 38. Connector 38 surrounds the adjacent ends of the tubes 32 and the connector 38 is held together using screws 39, as shown in FIG. 5. Alternatively, or in addition to the screws 39, the connector 38 may be provided with internal threads and the ends 40 of the tubes 32 may be provided with mating screw threads so that the ends 40 of the metal tubes 32 may be screwed into connector 38. Two sintered products, such as those shown in FIG. 4, can also be joined by local heating according to this invention. High-Tc superconducting ceramic oxide powder, of the same type as in the products to be joined, is inserted between the two portions of the sintered products to be joined. The two products to be joined are then pressed together, with the additional high-Tc superconducting powder therebetween, at a pressure between about $5 \times 10^4$ psi and $1 \times 10^7$ psi. Then the joint is subjected to a local heat treatment under conditions appropriate to render the joint superconducting. For example, if the joint is produced from a $YBa_2Cu_3O_x$ ceramic oxide, the joint is heated locally so that the joint is sintered in oxygen or air at a temperature of about 1000° C.+30° C., gradually cooled to about 550° C., annealed at about 550° C. for about 10 hours in oxygen or air, cooled to room temperature and then tested for superconducting properties. After the superconductivity of the joint is confirmed, the joint can be sealed by soldering, welding, screwing or any other available sealing method which will protect the joint from exposure to oxygen.

FIGS. 6a, 6b, 6c and 6d show additional shapes of sintered products which may be made by the macroscopic method of the present invention, as described above. High-Tc superconducting ceramic oxide product 50 of FIG. 6a, comprises a tube 52 having sintered superconducting ceramic oxide powder 54 pressed therein and having endcaps 56, 58 provided on the ends of the tube 52. Superconducting ceramic oxide product 50 is made by the macroscopic method described above. In making this product, the tube 52 may be bent to the 90° angle shown before or after pressurizing of the powder 54 therein. High-Tc superconducting ceramic oxide product 60 shown in FIG. 6b has a T-structure which is particularly suitable for making T-connections in superconducting products. The T-superconducting ceramic oxide product 60 shown in FIG. 6b comprises a metal tube 62, sintered superconducting ceramic oxide 64 and endcaps 66, 67 and 68. The T-shaped superconducting product 60 can be made by providing a tube, such as a metal tube, having a T-shape or by joining two straight tubes, as discussed with respect to FIGS. 2 and 3, to form the T-shaped structure.

Figure 6B:
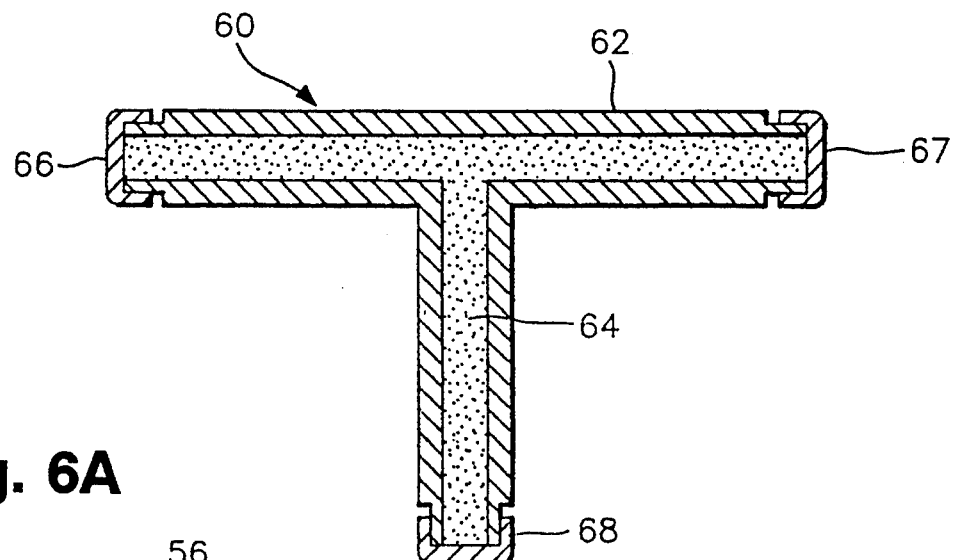
FIGS. 6a, 6b, 6c and 6d are cross-sectional views of embodiments of the high-Tc superconducting ceramic oxide products of the present invention having different shapes.
Figure 6A:
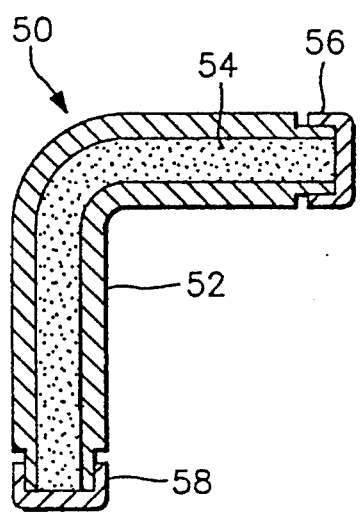
Figure 6C:
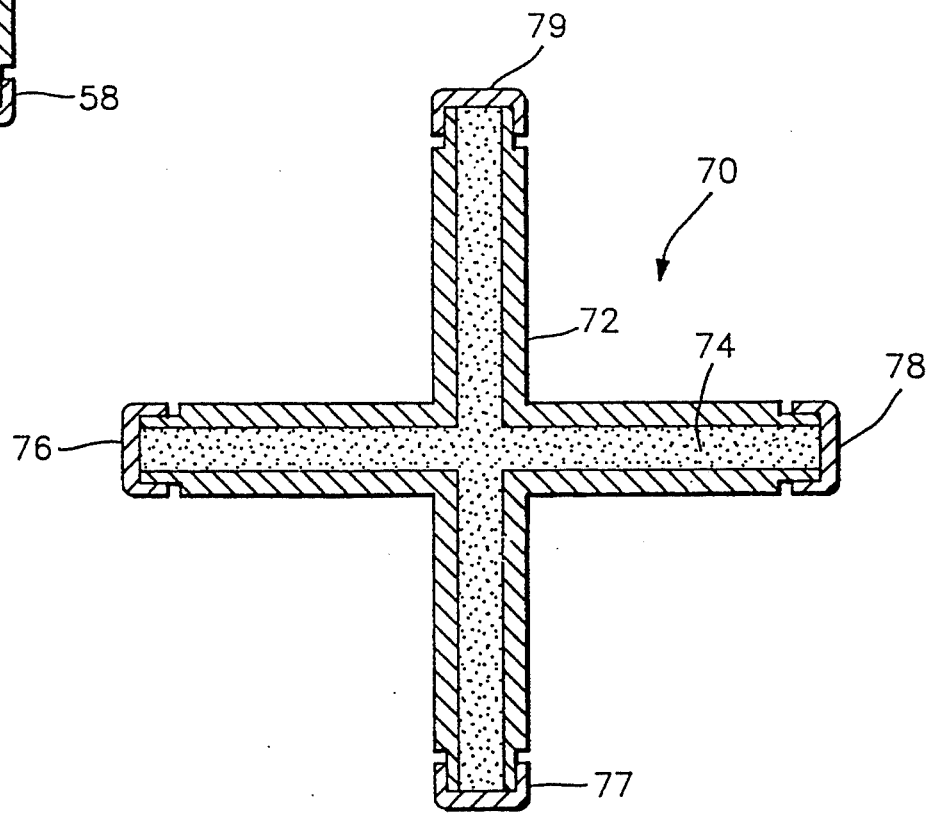

FIG. 6c shows a completely sealed, four-way superconducting connector produced by the macroscopic method of the present invention. The four-way connector 70 comprises a tube 72, a sintered superconducting ceramic oxide 74 and endcaps 76, 77, 78 and 79. The four-way superconducting connector 70 can be made by providing a four-way tube or by joining two tubes centrally and substantially opposite one another on opposite sides of a single tube to form a continuation superconducting four-way connector.

Although these embodiments have been described primarily with reference to joining two straight preforms, it is to be understood that more than two preforms and preforms having different configurations such as curved shapes can be joined in accordance with this invention. Any number of bodies of any configuration can be joined to form multi-joint structures.

Figure 6D:
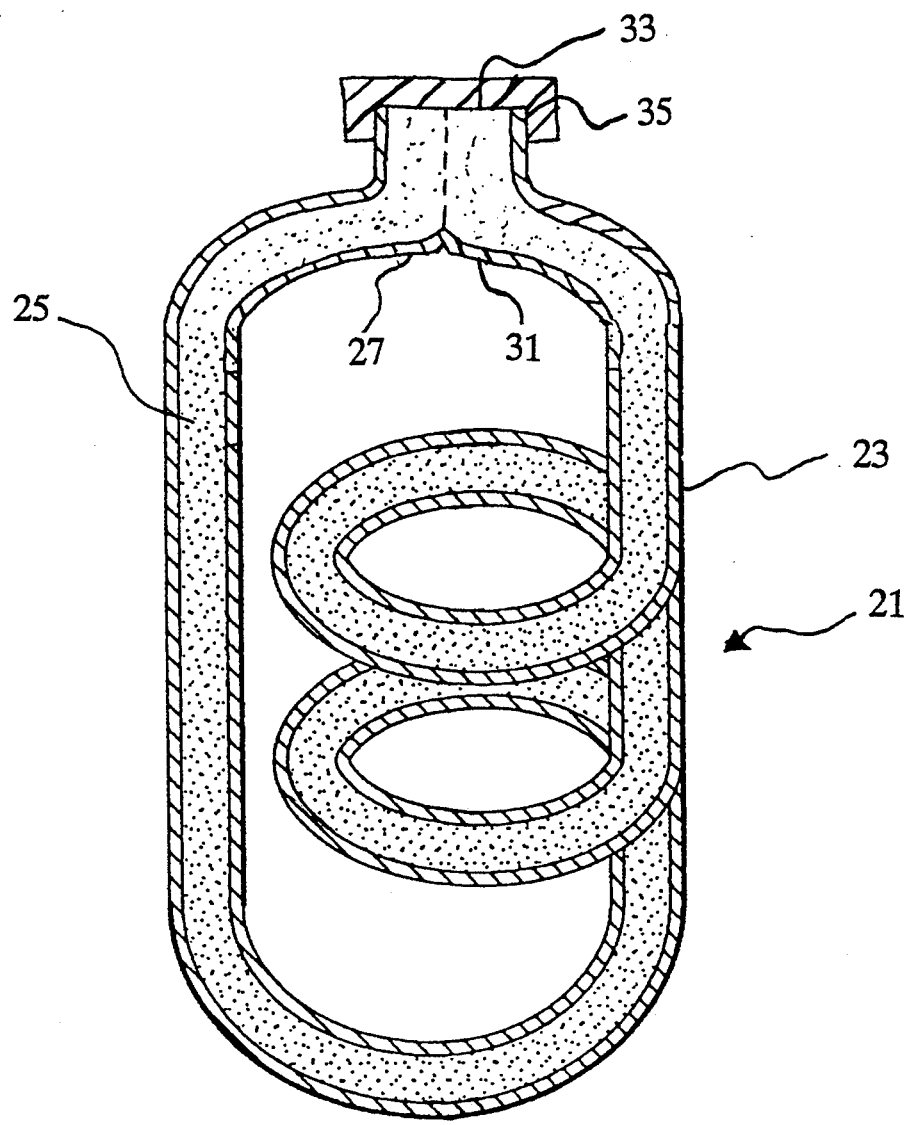

FIG. 6d shows another embodiment of the invention, in which two ends of one preform are joined to form a continuous loop structure 21. To form structure 21, longitudinal portions of a tube 23 are removed along the two ends thereof, after the tube 23 has been filled with high-Tc superconducting ceramic oxide powder 25. Then the open longitudinal portions of the tube 23 are pressed together, with the ceramic oxide powder 25 therebetween, and/or the two ends are joined and the ceramic oxide powder repressed thereinto from the open top, to form a complete loop. The portions 27, 31 of the tube are joined together by any suitable means and then the structure is subjected to a suitable heat treatment with the end 33 of the loop structure open, as described above, to sinter and anneal the high-Tc superconducting ceramic oxide powder. After testing the superconductivity of the sintered ceramic oxide powder, the end 33 is sealed with a cap 35 or other suitable sealing means.

Figure 7:
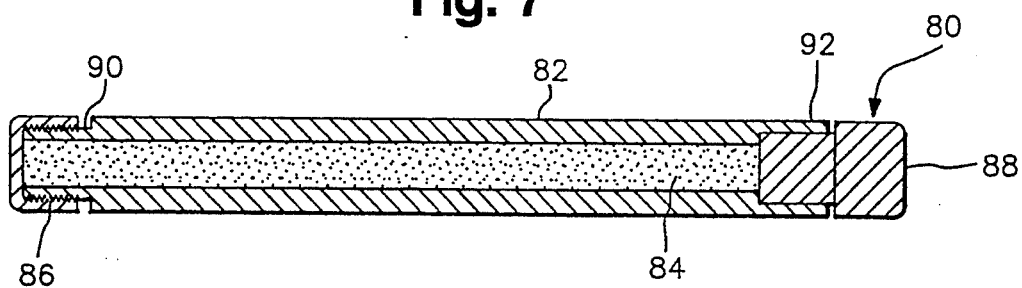
FIG. 7 is a cross-sectional view similar to FIG. 1, showing different end seal connections.

Referring now to FIG. 7, there is shown an alternate method of sealing the ends of a tube containing a sintered high-Tc superconducting ceramic oxide. The superconducting product 80, shown in FIG. 7, comprises a tube 82, a sintered superconducting ceramic oxide 84, an endcap 86 and an end sealing means 88. A first end 90 of the tube 82 is provided with internal threads which matingly engage endcap 86, which endcap is a female screw connector. End 92 of tube 82 is provided with internal threads and matingly engages female screw connector 88.

Although several different embodiments of a superconducting ceramic oxide product produced by the macroscopic method of the present invention have been described in detail above, it is to be understood that other shapes, configurations and sealing arrangements are contemplated within the scope of the present invention. In addition, modifications to the macroscopic process described in detail above may be made as necessary to adapt the process to superconducting ceramic oxides other than those specifically disclosed. Further, additional process steps may be employed together with the steps of the macroscopic process detailed above. For example, the sintering of the superconducting ceramic oxide powder may be conducted in an alternate magnetic field ($10^{-4}$ Tesla to 300 Tesla), as shown in FIG. 8a, to ensure high current density. Further, after long time use of the superconducting ceramic oxide products of the present invention, these products can be resintered in an oxygen atmosphere and resealed so that they can be used for another lengthy period of time.

In accordance with the principles of the invention, completely sealed superconducting products of various configurations can be made by depositing a high-Tc superconducting ceramic oxide material on the outer surface of a high melting material preform, preferably metal, which is inert to oxygen, subjecting the coated preform to an appropriate heat treatment to sinter and anneal the high-Tc superconducting ceramic oxide thereby making it superconducting, and then sealing the sintered high-Tc superconducting ceramic oxide layer with a coating of a metal which is inert to oxygen or with an insulator which is inert to oxygen. In this embodiment of the invention, the high-Tc superconducting ceramic oxide material can be deposited on the preform by any suitable means, including, but not limited to: immersing the preform in a suspension of the high-Tc superconducting ceramic oxide or in the liquid state of the high-Tc superconducting ceramic oxide; chemical vapor deposition, such as molecular chemical vapor deposition; electron beam deposition; sputtering; laser ablation deposition; and the like. Preferably, the high-Tc superconducting ceramic oxide material is deposited on the outer surface of the preform to form a continuous, substantially uniform layer having a thickness of between about $10^{-1}$ and $10^4$ micrometers.

Referring now to FIGS. 8b-14, the microscopic method of the present invention, and the superconducting ceramic oxide products produced thereby will be explained. The microscopic method comprises the steps of: forming a thin film of a high-Tc superconducting ceramic oxide composition by a known deposition technique such as electron beam deposition, sputtering deposition, molecular beam deposition, laser ablation or any other suitable method, optionally with an alternate magnetic field being applied during the film making process in situ or during the sintering process after film making to upgrade the quality of the thin film; and removing partial oxygen content from a microscopic domain of the thin film superconducting ceramic oxide by warming up the microscopic domain using a modified scanning tunneling microscope referred to hereinafter as an STETM (scanning tunneling electron treatment machine). Before STETM treatment, the insulator substrate upon which the thin film is initially formed must be removed, and then the high-Tc film supports itself or is coated with a supportive conductive layer. After the STETM treatment, the thin film is sealed with a suitable sealing layer to protect the oxygen content and make it stable. The potential barrier will protect the separation of the low oxygen domain and the high oxygen domain. If a thin conductive substrate is used for the thin film making, it need not be removed before STETM treatment.

The thin film as deposited can be superconducting or, optionally, the thin film can be sintered under conditions very similar to those described above with respect to the macroscopic methods, in order to produce a high-Tc superconducting thin film. Preferably, such sintering takes place in an alternate magnetic field as illustrated in FIG. 8b. The required characteristics of the magnetic field are alternate magnetic field waveforms in the range from $10^4$ Tesla to 300 Tesla. If the thin film is deposited on a substrate, the substrate may be of any suitable dimension, e.g., from $10^{-6}$ m to 1 cm in thickness. The substrate can be any oxide material except a CuO system. For example, the substrate could be an AlO or MgO system. The thin film generally has a thickness of from about 30 Å to about 10 μm, preferably between about 100 Å and 1000 Å.

Figure 9:
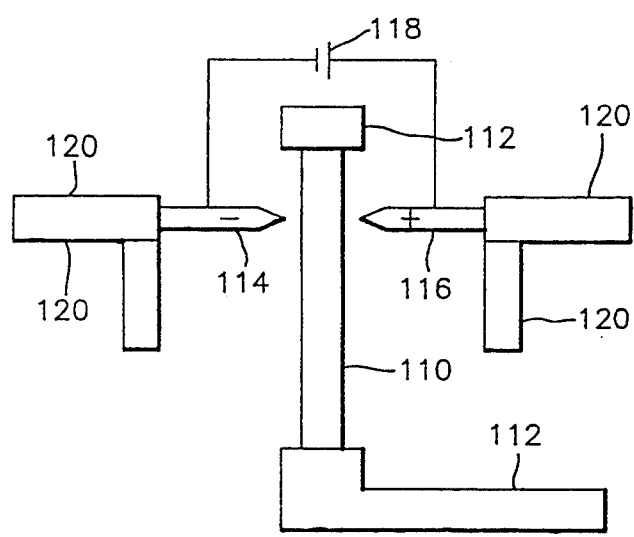
FIGS. 9, 10 and 11 are schematic illustrations of modified scanning tunneling machines, hereinafter referred to as STETMs (scanning tunneling electron treatment machines) useful in the microscopic method of the present invention.
Figure 10:
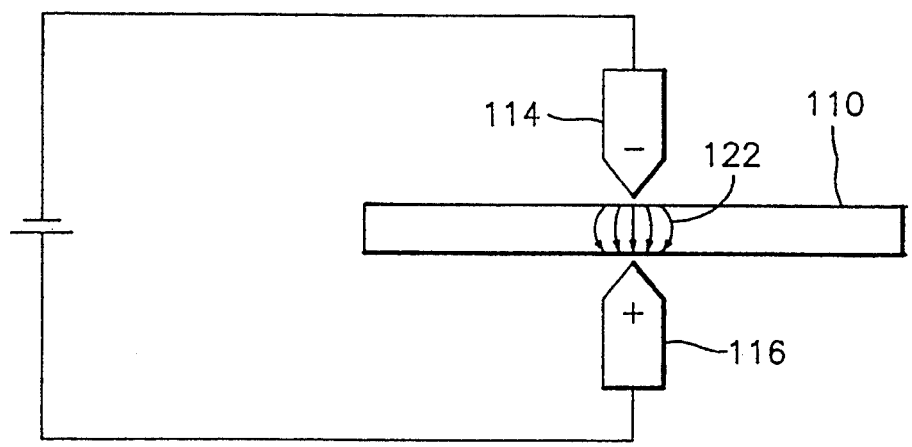
Figure 11:
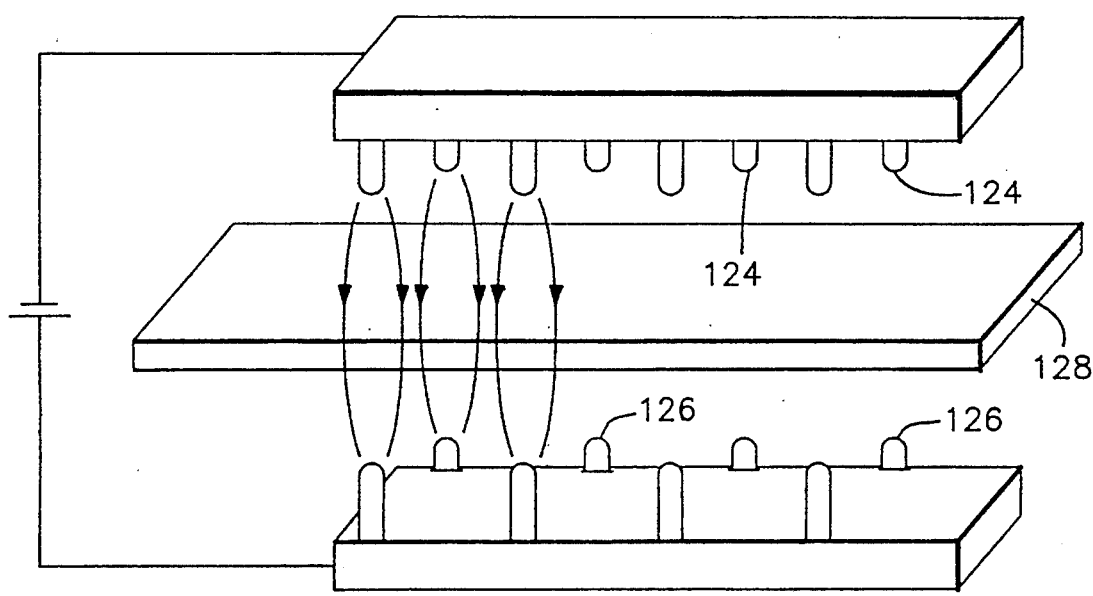

The STETM useful in practicing the microscopic method of the present invention is a modified STM having two tips opposite one another as shown in FIGS. 9 and 10, or having two opposed boards, each provided with a plurality of opposed tips as shown in FIG. 10. AC or DC current is passed between the opposed tips to locally heat up a microscopic domain having a size from about 5 Å to about 1000 Å. In the present invention, a thin high-Tc superconducting oxide film is held between the two tips or two boards of tips. When two tips are close to the film, the AC or DC current passing through the tips turns on a local domain of about 5 to 20 Å$^2$, to heat the thin film locally thereby removing oxygen content locally as desired. The opposed tips can be moved independently of one another or together with one another, as determined by a program controlling such movement. Although FIGS. 9-11 show a DC current source, it is to be understood that an AC current source could be substituted therefor. The current can be from about $10^{-6}$ Amps to about 100 Amps, depending on the type and thickness of the thin film and any supporting (conductive) substrate. The microscopic domain is heated to a temperature of between 200° and 900° C. in an argon atmosphere to remove the oxygen content of that microscopic domain and form a microscopic insulating domain.

The microscopic method of the present invention enables one or more microscopic insulating domains each having a size of between about 5 Å and 1000 Å to be formed in the superconducting ceramic oxide thin film. The microscopic insulation layers or domains between the high-Tc superconducting domains form Josephson junctions for SQUIDS or any high-Tc superconducting electric circuit. Compared to a 5000 Å insulation in a semiconductor, high-Tc superconducting microscopic circuits produced by the present invention can save space by a factor of $10^2 \times 10^2 \times 10^2$ for 3D circuits and $10^4$ for 2D circuits.

After the STETM treatment, the microscopic insulation layer is in a stable state and the adjacent superconducting domains are in a metastable state, and therefore, a potential barrier of oxygen molecule is established between the two states. The microscopic film contains the superconducting domain and the insulator domain is then completely sealed by applying a suitable coating sealing layer over the film, such as the sealing layer shown in FIG. 12. After wire connections are applied to the thin film structure as desired, the whole film is sealed except the wire. Therefore, the film, which contains superconducting and nonsuperconducting domains, will be sealed by the coating sealing layer. The $O_2$ content and the domain separations are thus protected by the sealing for long life. The oxygen content of the superconducting domain has nowhere to go because diffusion to the insulation domain requires excitation energy, which forms a potential barrier to separate the superconducting and insulating domains. Therefore, the sealed high-Tc superconducting chips exhibit long life. Liquid nitrogen or low noise refrigeration will guarantee the operation of the high-Tc superconducting circuits.

Referring now to FIG. 8b, there is shown the sintering of a superconducting thin film ceramic oxide in an alternate magnetic field. The thin film 100 is sintered in a furnace 102 in an oxygen atmosphere, with oxygen flowing into the furnace 102 through conduit 104. A alternate magnetic field is applied in the B direction by magnet solenoids 106.

FIG. 9 schematically illustrates the STETM treatment of superconducting thin film ceramic oxide 110 in accordance with the microscopic method of the invention. The thin film 110 is supported by support 112 such that the thin film 110 is substantially perpendicular to pins 114, 116 of the STETM. Pins 114,116 are connected to electric current source 118, with pin 114 having a negative potential and pin 116 having a positive potential or an alternate AC potential. Each of the pins 114, 116 is supported by three mutually perpendicular or orthogonal piezoelectric sticks 120, extending in the X, Y and Z directions. The pins can move independently or dependently by programming as desired. The current can be $10^{-6}$ Amp to 100 Amp. Voltage can be $10-3V$ to $10^4V$, depending on the material, thickness and the like. Treatment by a pair of opposed pins can be localized to 5 Å$^2$ or even smaller, and treatment by opposed boards each having a plurality of pins can be as large as 1 $\mu m^2$. The tips and boards can be made of tungsten, platinum, gold, and compounds thereof, as well as other suitable materials.

FIG. 10 schematically shows the flow of electrons 122 from the negative pin 114 to the positive pin 116 through the superconducting thin film 110 to remove oxygen content and form the microscopic insulating domain. FIG. 11 shows an alternative embodiment of the STETM wherein a plurality of opposed positive pins 126 and negative pins 124 are provided to simultaneously form a plurality of microscopic insulating domains in the thin film superconducting ceramic oxide 128.

Figure 12:
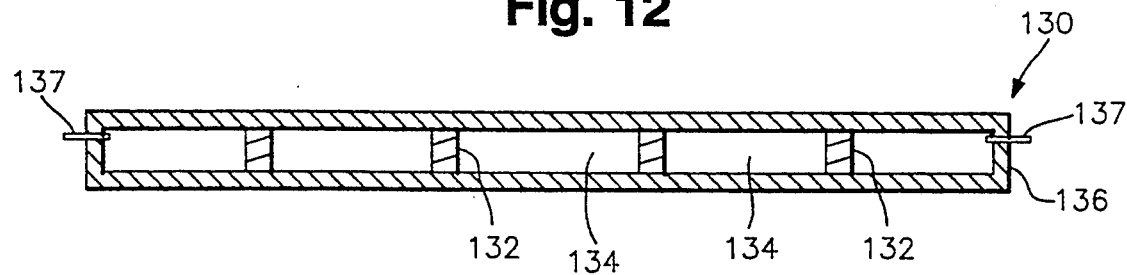
FIG. 12 is a schematic cross-sectional view of a high-Tc superconducting ceramic oxide film provided with low oxygen content insulating domains produced by the microscope method of the invention.

FIG. 12 illustrates a superconducting thin film ceramic oxide product 130 produced by the microscopic method of the present invention. The superconducting thin film ceramic oxide product 130 comprises a plurality of microscopic insulating domains 132 between adjacent high-Tc superconducting domains 134. A sealing layer 136 is provided around the superconducting thin film ceramic oxide to prevent loss of oxygen from the superconducting domains and to prevent the resultant loss of superconductivity and protect the separation between the superconducting and nonsuperconducting domains. Because the potential barrier is sealed and isolates the areas surrounding it, no excitation energy can be provided to overcome the potential barrier and the superconductivity circuit has a long lifetime. The sealing layer is an insulating coating layer which is inert to oxygen and can be applied by any suitable means, such as spraying, coating, immersion, and the like. Elements 137 are wire connections.

Figure 13:
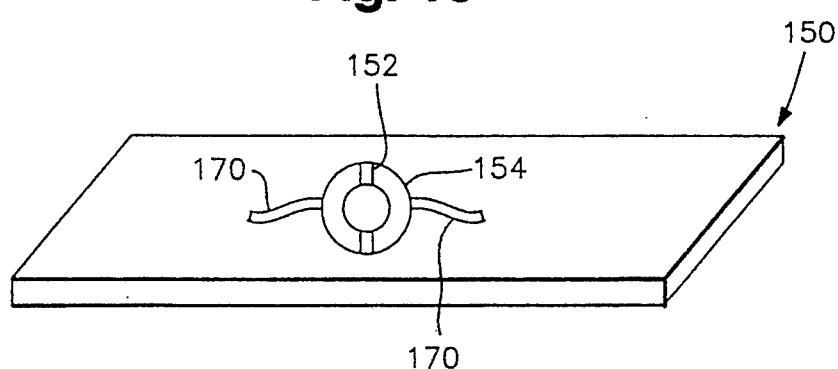
FIG. 13 is a schematic illustration of a SQUID made by the microscopic method of the invention.
Figure 14:
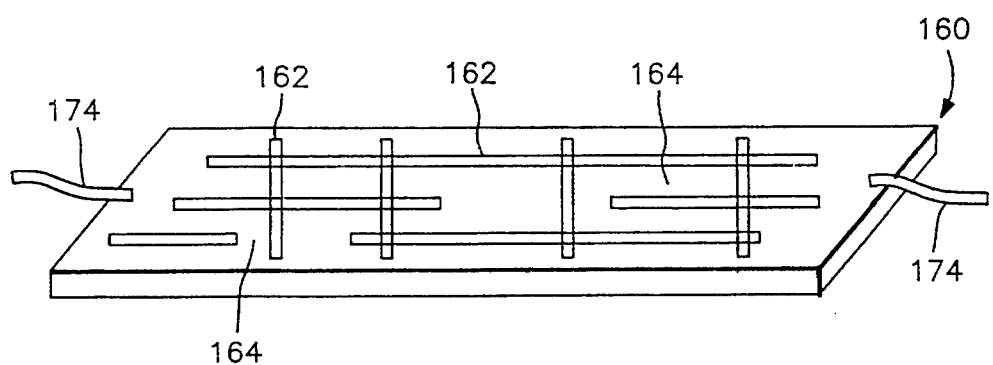
FIG. 14 is a schematic illustration of an integrated circuit made by the microscopic method of the invention.

Finally, FIGS. 13 and 14 illustrate, respectively, a SQUID 150 made by the microscopic method of the present invention and an integrated circuit 160 made by the microscopic method of the invention. More specifically, FIG. 13 shows a SQUID 150 having a high-Tc superconducting loop 152 and a Josephson junction 154 which can be as small as 5 Å-20 Å (i.e., close to the coherence length of about 5 Å on $CuO_2$ plane) formed by the microscopic insulating domain. The microscopic process of the present invention is unique in that it can make such small and accurate high quality SQUIDs. The SQUID of FIG. 13 is made from a high quality high-Tc superconducting film. The film is held in the STETM and a superconducting ring is masked. The remainder of the film area is treated by the STETM to remove oxygen content and form an insulting area or domain. A Josephson junction is then made by the STETM treatment of the desired areas of the remaining superconducting ring. A wire connection 170 is then made and the whole film structure is sealed except the wire connection.

FIG. 14 shows an integrated circuit 160 comprising insulating layers or domains 162 and high-Tc superconducting domains 164. The integrated circuit 160 is similarly made by treating a thin high-Tc superconducting film with the STETM to produce a desired pattern of insulating domains 164 and superconducting domains 162; affixing wire connections 174 to the resultant structure; and then sealing the structure with the exception of the wire connections.

The description of the preferred embodiments contained herein is intended in no way to limit the scope of the invention. As will be apparent to a person skilled in the art, modifications and adaptations of the structure and method of the above-described invention will become readily apparent without departure from the spirit and scope of the invention, the scope of which is described in the appended claims.

What is claimed is:

1. A method of making a high-Tc superconducting product comprising a continuous high-Tc superconducting ceramic oxide closed loop and having essentially zero electrical resistance in said continuous closed loop, said method comprising the steps of:

providing a hollow body of a material inert to oxygen, wherein said hollow body has two open ends;

pressing a high-Tc superconducting ceramic oxide powder into said hollow body; and then joining a first portion of one of said open ends to a first portion of the other of said open ends and leaving a second portion of each of said ends unjoined, thereby forming a continuous high-Tc superconducting ceramic oxide loop within said hollow body with the unjoined portions cooperatively forming an opening providing access to said ceramic oxide powder; and then through said opening; repressing said high-Tc superconducting ceramic oxide powder in the hollow ceramic body extending throughout said hollow body; and then heat treating the hollow body and said continous high-Tc ceramic body in an oxygen-containing atmosphere at sufficient temperatures and for time periods such that the high-Tc ceramic body becomes sintered, annealed, and cooled; and then sealing said opening, thereby preventing oxygen loss; wherein said sintering step is the only sintering of the high-Tc superconducting ceramic oxide powder.

2. The method, according to claim 1, wherein the pressing of the high-Tc superconducting ceramic oxide powder into said hollow body is at a net pressure of from about $5 \times 10^4$ psi to about $1 \times 10^7$ psi.

3. The method, according to claim 1, wherein the high-Tc superconducting ceramic oxide powder is selected from the group consisting of $YBa_2Cu_3O_x$, wherein x is between 6.5 and 7.0; BiSrCaCuO systems;

HgBaCaCuO systems; (Bi,Pb)SrCaCuO systems; LaSrCuO systems; and TlBaCaCuO systems.

4. The method, according to claim 1, wherein the repressing of the high-Tc superconducting ceramic oxide powder in the hollow body is at a pressure between about $5 \times 10^4$ psi and about $1 \times 10^7$ psi.

5. The method, according to claim 1, which further comprises the step of applying an alternate or selective wave form pulse magnetic field during said heat treatment to accelerate the occupation by oxygen in the $CuO_2$ planes and to orient the $CuO_2$ plane to a desired direction.

6. The method, according to claim 1, wherein said hollow body is made of a material which is inert to oxygen and is selected from the group consisting of silver, silver alloys, stainless steel, copper, and copper-nickel alloys or combinations thereof.

7. The method, according to claim 1, wherein said hollow body is either coated on the inside with a material which is inert to oxygen or has a second tube of material inert to oxygen nested within said hollow body.

8. The method, according to claim 7, wherein said material is silver or a silver alloy.

9. The method, according to claim 1, further comprising the step of surrounding the joined portions by a solid metal base during the repressing of said high-Tc superconducting ceramic oxide powder.

* * * * *

UNITED STATES PATENT AND TRADEMARK OFFICE
CERTIFICATE OF CORRECTION

PATENT NO. : 5,432,150
DATED : July 11, 1995
INVENTOR(S) : Dawei Zhou

It is certified that error appears in the above-indentified patent and that said Letters Patent is hereby corrected as shown below:

Column 3: line 65: "$Cu_2$ plane" should read --$CuO_2$ plane--.
Column 12: line 1: "$10^4$ Tesla" should read --$10^{-4}$ Tesla--.
Column 14: line 49: "opening; repressing" should read --opening, repressing--; lines 50-52: "in the hollow ceramic body extending throughout said hollow body; and then" should read --in the hollow body, thereby making a continuous high-Tc ceramic body extending throughout said hollow body; and then--.
Column 15: line 2: "TlBaCaCuO" should read --TlBaCaCuO--.

Signed and Sealed this

Twenty-seventh Day of February, 1996

Attest:

BRUCE LEHMAN

Attesting Officer    Commissioner of Patents and Trademarks